(12) United States Patent
Yoo et al.

(10) Patent No.: US 12,266,568 B2
(45) Date of Patent: Apr. 1, 2025

(54) INTERCONNECT WIRES INCLUDING RELATIVELY LOW RESISTIVITY CORES

(71) Applicant: Intel Corporation, Santa Clara, CA (US)

(72) Inventors: Hui Jae Yoo, Portland, OR (US); Tejaswi K. Indukuri, Boise, ID (US); Ramanan V. Chebiam, Hillsboro, OR (US); James S. Clarke, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 18/535,623

(22) Filed: Dec. 11, 2023

(65) Prior Publication Data

US 2024/0112952 A1   Apr. 4, 2024

Related U.S. Application Data

(60) Continuation of application No. 18/088,474, filed on Dec. 23, 2022, now Pat. No. 11,881,432, which is a (Continued)

(51) Int. Cl.
*H01L 21/768* (2006.01)
*H01L 23/532* (2006.01)

(52) U.S. Cl.
CPC .. *H01L 21/76849* (2013.01); *H01L 21/76838* (2013.01); *H01L 21/76877* (2013.01);
(Continued)

(58) Field of Classification Search
CPC ......... H01L 21/76849; H01L 21/76877; H01L 23/53209; H01L 23/53228; H01L 23/53238; H01L 23/53252; H01L 23/53257; H01L 23/53266; H01L 21/76843; H01L 21/76838; H01L 21/76882; H01L 23/53214; H01L 23/5324;
(Continued)

(56) References Cited

U.S. PATENT DOCUMENTS 6,060,388 A   5/2000   Akatsu et al.
6,515,367 B1  2/2003   Bernard et al.
(Continued)

FOREIGN PATENT DOCUMENTS

CN   1867411      1/2006
CN   101075578   11/2007
(Continued)

OTHER PUBLICATIONS

Office Action from Korean Patent Application No. 10-2022-7045128, mailed Dec. 22, 2023, 8 pgs.
(Continued)

*Primary Examiner* — Thanh Y. Tran
(74) *Attorney, Agent, or Firm* — Schwabe, Williamson & Wyatt P.C.

(57) ABSTRACT

A dielectric layer and a method of forming thereof. An opening defined in a dielectric layer and a wire deposited within the opening, wherein the wire includes a core material surrounded by a jacket material, wherein the jacket material exhibits a first resistivity $\rho 1$ and the core material exhibits a second resistivity $\rho 2$ and $\rho 2$ is less than $\rho 1$.

18 Claims, 10 Drawing Sheets

Related U.S. Application Data continuation of application No. 17/061,062, filed on Oct. 1, 2020, now Pat. No. 11,569,126, which is a continuation of application No. 15/631,701, filed on Jun. 23, 2017, now Pat. No. 10,832,951, which is a continuation of application No. 15/096,609, filed on Apr. 12, 2016, now Pat. No. 9,691,657, which is a division of application No. 14/038,502, filed on Sep. 26, 2013, now Pat. No. 9,349,636.

(52) U.S. Cl.
CPC .. *H01L 21/76882* (2013.01); *H01L 23/53209* (2013.01); *H01L 23/53214* (2013.01); *H01L 23/53228* (2013.01); *H01L 23/53238* (2013.01); *H01L 23/53242* (2013.01); *H01L 23/53252* (2013.01); *H01L 23/53257* (2013.01); *H01L 23/53266* (2013.01); *H01L 21/76843* (2013.01); *H01L 2224/45015* (2013.01); *H01L 2924/0002* (2013.01)

(58) Field of Classification Search
CPC ....... H01L 2224/45015; H01L 23/5226; H01L 23/5228; H01L 23/5283
See application file for complete search history.

(56) References Cited

U.S. PATENT DOCUMENTS

| | | | |
|---|---|---|---|
| 6,566,250 | B1 | 5/2003 | Pai |
| 6,569,757 | B1 | 5/2003 | Weling |
| 6,597,067 | B1 | 7/2003 | Biery |
| 6,734,559 | B1 | 5/2004 | Yang |
| 6,841,473 | B1 | 1/2005 | Wang |
| 6,927,113 | B1 | 8/2005 | Sahota |
| 7,008,872 | B2 | 3/2006 | Dubin |
| 7,550,819 | B2 | 6/2009 | Yamashita |
| 7,642,185 | B2 | 1/2010 | Owada |
| 8,053,907 | B2 | 11/2011 | Xiao |
| 8,193,087 | B2 | 6/2012 | Shih |
| 8,461,683 | B2 | 6/2013 | Yoo |
| 9,691,657 | B2 | 6/2017 | Yoo |
| 10,832,951 | B2 | 11/2020 | Yoo |
| 2002/0028575 | A1 | 3/2002 | Besling |
| 2003/0013290 | A1 | 1/2003 | Greer |
| 2003/0111733 | A1 | 6/2003 | Pogge |
| 2003/0164532 | A1 | 9/2003 | Liu |
| 2003/0194858 | A1 | 10/2003 | Lee et al. |
| 2004/0096592 | A1 | 5/2004 | Chebiam |
| 2004/0099908 | A1 | 5/2004 | Durlam |
| 2005/0098897 | A1 | 5/2005 | Edelstein |
| 2005/0108876 | A1 | 5/2005 | Mathieu |
| 2005/0121711 | A1 | 6/2005 | Pogge |
| 2005/0141148 | A1 | 6/2005 | Aikawa |
| 2005/0161817 | A1 | 7/2005 | Meyer |
| 2006/0128144 | A1 | 6/2006 | Park |
| 2006/0189118 | A1 | 8/2006 | Luo |
| 2006/0267201 | A1 | 11/2006 | Huebler |
| 2007/0013073 | A1 | 1/2007 | Cabral |
| 2007/0132100 | A1 | 6/2007 | Ikeda et al. |
| 2007/0257369 | A1 | 11/2007 | Huang |
| 2008/0054464 | A1 | 3/2008 | Ikeda et al. |
| 2008/0120580 | A1 | 5/2008 | Hsu |
| 2008/0206986 | A1 | 8/2008 | Preusse |
| 2008/0230891 | A1 | 9/2008 | Pogge |
| 2008/0237863 | A1 | 10/2008 | Toyoda |
| 2008/0246151 | A1 | 10/2008 | Yang |
| 2008/0251926 | A1 | 10/2008 | Tada et al. |
| 2008/0296768 | A1 | 12/2008 | Chebiam et al. |
| 2009/0001591 | A1 | 1/2009 | Haverty et al. |
| 2009/0065955 | A1 | 3/2009 | Gordon |
| 2009/0166867 | A1 | 7/2009 | Simka |
| 2009/0200668 | A1 | 8/2009 | Yang |
| 2009/0273084 | A1 | 11/2009 | Ayotte |
| 2009/0298281 | A1 | 12/2009 | Yang et al. |
| 2009/0325375 | A1 | 12/2009 | Preusse |
| 2010/0065967 | A1 | 3/2010 | Koike et al. |
| 2010/0102449 | A1 | 4/2010 | Ikeda et al. |
| 2010/0117232 | A1* | 5/2010 | Nakao ............... H01L 23/53295 257/E21.584 |
| 2010/0133648 | A1 | 6/2010 | Seidel |
| 2010/0154213 | A1 | 6/2010 | Koike et al. |
| 2010/0171220 | A1 | 7/2010 | Huang |
| 2011/0049727 | A1 | 3/2011 | Aubel |
| 2012/0015514 | A1 | 1/2012 | Noguchi |
| 2012/0121799 | A1 | 5/2012 | Fu et al. |
| 2012/0295438 | A1 | 11/2012 | Koike |
| 2013/0078797 | A1 | 3/2013 | Sun et al. |
| 2013/0189827 | A1 | 7/2013 | Ding |
| 2013/0221527 | A1 | 8/2013 | Yang et al. |
| 2013/0224947 | A1 | 8/2013 | Noguchi |
| 2013/0270703 | A1 | 10/2013 | Zierath |
| 2014/0076611 | A1 | 3/2014 | Choi |
| 2015/0069620 | A1 | 3/2015 | Chi |

FOREIGN PATENT DOCUMENTS

| | | |
|---|---|---|
| CN | 101512048 | 8/2009 |
| CN | 101630667 | 1/2010 |
| CN | 102332426 | 1/2012 |
| CN | 102881677 | 1/2013 |
| CN | 105493243 | 4/2016 |
| EP | 0949673 | 10/1999 |
| JP | 2005-235995 | 9/2005 |
| KR | 20070112035 | 11/2007 |
| TW | 200616017 | 5/2006 |
| TW | 201225230 | 6/2012 |
| WO | WO 2013/095433 | 6/2013 |

OTHER PUBLICATIONS

Office Action from Chinese Patent Application No. 201480047060.7, mailed Mar. 5, 2018, 8 pages.
Search Report from European Patent Application No. 14849833.0, mailed Apr. 11, 2017, 7 pages.
Office Action from Taiwan Patent Application No. 103132990, mailed Jan. 13, 2016, 15 pages.
Notice of Allowance from Taiwan Patent Application No. 103132990, mailed Jul. 14, 2016, 2 pages.
Preliminary Examination Report for Malaysian Patent Application No. PI2016700614, mailed Jul. 4, 2016, 2 pages.
International Search Report and Written Opinion for PCT/US2014/057351, mailed Dec. 30, 2014, 11 pages.
International Preliminary Report on Patentability for PCT/US2014/057351, mailed Apr. 7, 2016, 8 pages.
Awaah, "Cooper Metallization Technology," Elec 7730 Advanced Plasma Processing for Microelectronic Fabrication.
Abe et al., "Formation of copper interconnects by the reflow of sputtered copper films", Mar. 23, 2007, downloaded from http://onlinelibrary.wiley.com/doi/10.1002/ecjb.4420790812/abstract.
"Interconnects" Lecture 15, Spring 2005.
Office Action from U.S. Appl. No. 14/038,502, filed Jun. 4, 2015, 10 pages.
Office Action from U.S. Appl. No. 15/096,609, filed Oct. 5, 2016, 10 pages.
Office Action from Chinese Patent Application No. 201480047060.7, mailed Jan. 24, 2019, 6 pgs.
Office Action from Singapore Patent Application No. 10201803987P, mailed Mar. 26, 2019, 6 pgs.
Office Action from Chinese Patent Application No. 201480047060.7, mailed Jul. 16, 2019, 10 pgs.
Office Action from Chinese Patent Application No. 201710951501.1, mailed Oct. 9, 2019, 11 pgs.
Office Action from European U.S. Appl. No. 14/849,833, filed Apr. 29, 2020, 7pgs.
Office Action from Chinese Patent Application No. 201480047060.7, mailed Mar. 26, 2020, 9pgs.

(56) References Cited

OTHER PUBLICATIONS

Office Action from Chinese Patent Application No. 201480047060.7, mailed Jul. 23, 2020, 5 pgs.
Office Action from Chinese Patent Application No. 201710951501.1, mailed Aug. 3, 2020, 8 pgs.
Office Action from Korean Patent Application No. 10-2016-7001980.1, mailed Sep. 29, 2020, 11 pgs.
Office Action from Chinese Patent Application No. 201480047060.7, mailed Mar. 4, 2021, 4 pgs.
Office Action from Chinese Patent Application No. 201710951501.1, mailed Mar. 1, 2021, 11 pgs.
Office Action from Korean Patent Application No. 10-2016-7001980, mailed Apr. 30, 2021, 9 pgs.
Office Action from Chinese Patent Application No. 201480047060.7, mailed Jun. 15, 2021, 8 pgs.
Office Action from Chinese Patent Application No. 201710951501.1, mailed Jul. 1, 2021, 7 pgs.
Office Action from Korean Patent Application No. 10-2016-7001980, mailed Nov. 30, 2021, 10 pgs.
Notice of Allowance from Chinese Patent Application No. 201710951501.1, mailed Dec. 24, 2021, 8 pgs.
Office Action from Korean Patent Application No. 10-2022-7000243, mailed Mar. 28, 2022, 7 pgs.
Office Action from Korean Patent Application No. 10-2016-7001980, mailed Apr. 21, 2022, 6 pages.
Notice of Allowance from Korean Patent Application No. 10-2016-7001980, mailed Aug. 26, 2022, 5 pages.
Final Office Action from Korean Patent Application No. 10-2022-7000243, mailed Sep. 30, 2022, 5 pgs.
Office Action from Korean Patent Application No. 10-2022-7045128, mailed Mar. 30, 2023, 6 pgs., with English summary.
Office Action from Chinese Patent Application No. 20111073470.7, mailed Apr. 19, 2024, 11 pgs.
Office Action from Korean Patent Application No. 10-2022-7045128, mailed Aug. 29, 2024, 5 pgs.
Office Action from Chinese Patent Application No. 20111073470.7, mailed Nov. 18, 2024, 8 pgs.
Notice of Allowance from Korean Patent Application No. 10-2022-7045128, mailed Jan. 23, 2025, 5 pgs.

\* cited by examiner

INTERCONNECT WIRES INCLUDING RELATIVELY LOW RESISTIVITY CORES

CROSS REFERENCE TO RELATED APPLICATION

This present application is a continuation of U.S. patent application Ser. No. 18/088,474, filed Dec. 23, 2022, which is a continuation of U.S. patent application Ser. No. 17/061,062, filed Oct. 1, 2020, now U.S. Pat. No. 11,569,126, issued Jan. 31, 2023, which is a continuation of U.S. patent application Ser. No. 15/631,701, filed Jun. 23, 2017, now U.S. Pat. No. 10,832,951, issued Nov. 10, 2020, which is a continuation of U.S. patent application Ser. No. 15/096,609, filed Apr. 12, 2016, now U.S. Pat. No. 9,691,657, issued Jun. 27, 2017, which is a divisional to U.S. application Ser. No. 14/038,502, filed Sep. 26, 2013, now U.S. Pat. No. 9,349,636, issued May 24, 2016, which are hereby incorporated by reference in their entirety and for all purposes.

FIELD

The present disclosure relates to wires, such as interconnects, that include cores embedded within jackets, and in particular, wires that include cores exhibiting relatively lower resistivity than the jackets.

BACKGROUND

As integrated circuit features are scaled down and density increases, material properties such as resistivity, which influences observed resistance, exhibit relatively more pronounced effects. For example, as feature size drops, interconnect delay may exceed gate delay and form a relatively large portion of total device delay. Interconnect delay is understood to be caused, at least in part, by resistive-capacitance delay. Resistive-capacitance delay, or RC delay, is understood as the delay of signal propagation as a function of resistance, which is in part dependent on the resistivity of the metal wire composition, and as a function of insulator capacitance, which is in part dependent on the permittivity of the interlayer dielectric. Prior solutions to reduce RC delay included wire geometry optimization.

Furthermore, reliability of integrated circuits is affected by a number of stresses that increase as feature size drops and density increases. These stresses include electrical, thermal, mechanical and environmental stress. Electromigration is an example of phenomena that reduces semiconductor reliability, leads to interconnect failure, and becomes relatively more prominent as feature size is decreased and power density increases. Electromigration is understood as the transport of material due to movement of ions in a conductor. Electromigration may result in the formation of hillocks or voids in the interconnects and eventually lead to failure.

To reduce electromigration, and other stress induced failures, refractory metals have been used in interconnect fabrication. However, refractory metals exhibit increased resistivity and, therefore, increased resistance, increasing resistive-capacitance delay. To further reduce electromigration, and other stress induced failures, diffusion barriers have been deposited on the side and bottom walls of openings in interlayer dielectrics containing the interconnects. Diffusion barriers are understood to occupy a small fraction (typically 20% or less) of the cross-sectional area of the interconnect wire. The portion of the interconnect exposed at the surface of a given dielectric layer is coated with an insulator such as silicon nitride. However, such an arrangement may adversely affect wire properties such as capacitance.

Therefore, as feature sizes continue to decrease, room remains for the improvement in the design of interconnects with, in some instances, an emphasis on interconnect delay and resistance to various stresses, such as those resulting in electromigration and thermomechanical failures.

BRIEF DESCRIPTION OF THE DRAWINGS

The above-mentioned and other features of this disclosure, and the manner of attaining them, may become more apparent and better understood by reference to the following description of embodiments described herein taken in conjunction with the accompanying drawings, wherein.

DETAILED DESCRIPTION

The present disclosure is directed to the formation of interconnect wires including cores formed within a jacket. The cores exhibit a relatively lower resistivity than the jacket, which provides a diffusion barrier and anti-scattering properties, i.e., electron scatting at the core surface. As noted above, as integrated circuits are scaled down, certain material properties, such as resistivity, exhibit relatively more pronounced effects. For example, interconnect delay may exceed gate delay and form a relatively large portion of the total device delay. Interconnects or interconnect wires (also referred to herein as wires) may be understood as connections between components on, for example, an integrated circuit. Components include, for example, transistors, diodes, power sources, resistors, capacitors, inductors, sensors, transceivers, receivers, antennas, etc. Interconnect delay is understood to be caused, at least in part, by resistive-capacitance delay or RC delay, the delay of a signal due to the resistive-capacitive effects of the interconnect material. Resistance-capacitive delays may be reduced by the use of lower resistivity interconnect materials. In addition, material properties and current density affect electromigration, which is understood as the transport of material due to movement of ions in a conductor. Electromigration may result in voids or hillocks forming in the interconnect causing failure. The present disclosure is directed to providing wires that reduce RC delay as well as electromigration using the wires and methods of forming such wires described herein.

Figure 1A:
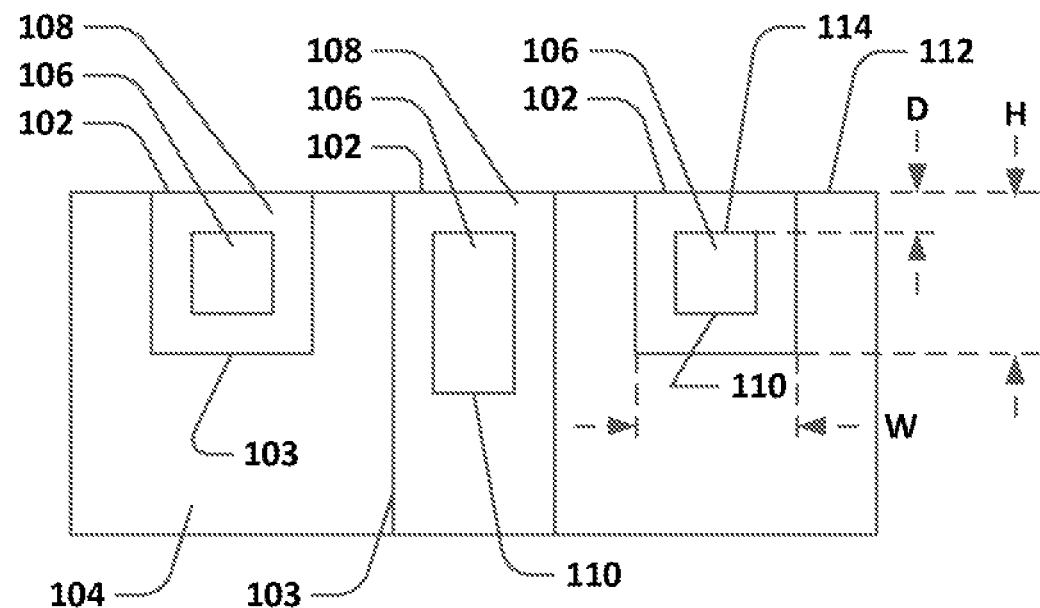
FIG. 1a illustrates a cross-section of FIG. 1B of an embodiment of a plurality of wires formed in openings in an interlayer dielectric, wherein the wires include a core and a jacket.
Figure 1B:
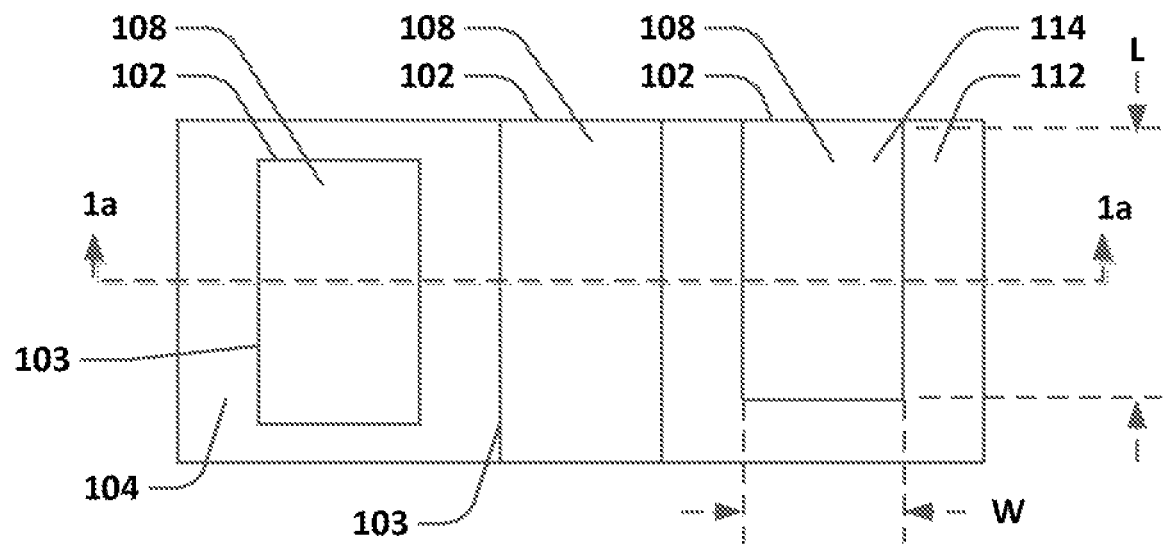
FIG. 1B illustrates a top view of the embodiment of a plurality of wires formed in openings in the interlayer dielectric.

FIGS. 1a and 1b illustrate an embodiment including a plurality of wires 102, such as interconnects, formed in openings 103 in a metallization layer 104 such as an interlayer dielectric. The openings 102 have a length, width and height and assume a number of cross-sectional geometries, such as U-shaped channels, v-shaped channels, etc. The metallization layer includes a dielectric material, which is understood to be a material that is an insulator but is polarized upon application of an electric field. In embodiments, the dielectric includes a low-k dielectric, that is, a material with a dielectric constant that is lower than 3.9, the dielectric constant of silicon dioxide, including all values and ranges from 1.5 to 3.8, such as 1.7, 1.9, 2.1, 2.8, 2.7, etc. Non-limiting examples from which the dielectric material may be selected include fluorine-doped silicon dioxide, carbon-doped silicon dioxide, organo silicate glass, silicon oxycarbide, hydrogenated silicon oxycarbide, porous silicon dioxide, and organic polymer dielectrics such as polyimide, polytetrafluoroethylene, polynorbornenes, benzocyclobutene, hydrogen silsesquioxane and methylsilsesquioxane. The metallization layer may have a thickness in the range of 50 nm to 300 nm, including all values and ranges therein, such as 50 nm to 100 nm, 50 nm to 200 nm, etc.

The wires 102 include cores 106 of a first material surrounded in jackets 108 of a second material. In embodiments, the width W of openings 103 in the metallization layer 104 and, therefore, the wires 102, may be in the range of 5 nm to 100 nm, including all values and ranges therein, such as 10 nm, 20 nm, 25 nm, 30 nm, 35 nm, 40 nm, 45 nm, 50 nm, etc. The height H of the openings 103 and, therefore, the wires 102 may be in the range of 10 nm to 200 nm, including all values and ranges therein, such as 10 nm, 20 nm, 25 nm, 30 nm, 35 nm, 40 nm, 45 nm, 50 nm, etc. The length L (see FIG. 1B) of the wires may be range from sub- to several microns, including all values and ranges from 0.01 lam to 5.0 μm, such as 0.05 μm, 0.1 μm, 1 μm, 2 μm.

While the wire geometry is illustrated as being generally square or rectangular and having relatively sharp corners, the wire geometry may be circular, elliptical, or exhibit rounded corners of varying radii. Furthermore, the core geometry may be different than the jacket geometry. For example, the core may be rectangular and the jacket may be squared or the core may be square and the jacket rectangular. If the jacket and core exhibit similar geometries, the aspect ratio of jacket geometry may be the same or different from the aspect ratio of the core geometry. In addition, the core may be either centered or offset relative to the cross-section of the wire.

As illustrated, the jacket 108 surrounds the outer surface 110 of the core material 106, contacting the sides of the wire core 106. The jacket 108 is present between the metallization layer 104 and the core 106, as well as at the upper surface 114 of the wire 102 where the dielectric material of that specific metallization layer is not present. In embodiments, the jacket 108 bonds to the exterior surface 110 of the core 106 either through inter-diffusion of the jacket and core materials or due to chemical bonding between the jacket and core materials. The jacket 108 occupies 25% to 75% of the volume of a wire 102, including all values and ranges therein, such as 50% to 75% of the volume of the wire 102. And, the core occupies 25% to 75% of the volume of the wire 102, including all values and ranges therein, such as 25% to 50% of the volume of the wire 102.

In embodiments, the jacket 108 occupies 25% or more of a cross-sectional area of the wire 102, including all values and ranges from 25% to 75%, and in particular, 50% to 75%, etc. The cross-sectional area is measured perpendicular to the length L of the wire, or other aspect of the wire (length, width or height) exhibiting the largest dimension as illustrated in FIGS. 1a and 1b. The core 106 occupies 75% or less of the cross-sectional area of the wire 102, including all values and ranges from 25% to 75%, and in particular 25% to 50%. Furthermore, as illustrated, the core 106 is provided below the mesas or upper surface 112 of the metallization layer 104, wherein a distance D is present between the upper surface 114 of the core 106 and the upper surface 112 of the metallization layer 104. The distance D may be up to 40% of the entire height H of the wire 102, including all values and ranges from 1% to 40%, 5% to 30%, 10% to 20%, etc, wherein D=x*H, wherein x is from 0.01 to 0.40.

In embodiments, the core material exhibits a resistivity, ρ1, of 4.0 μΩ·cm or less, including all values and ranges from 1.0 μΩ·cm to 4.0 μΩ·cm, such as 1.7, 2.7, etc. The jacket material exhibits a resistivity, ρ2, of 5.0 μΩ·cm or greater, including all values and ranges from 5.0 μΩ·cm to 8.0 μΩ·cm. Thus, the material forming the wire cores, exhibits a lower resistivity than the material forming the wire jackets, wherein ρ1<ρ2, ρ1 is the resistivity of the core material, and ρ2 is the resistivity of the jacket material. The core material also exhibits a relatively lower melting temperature than the jacket material, wherein T1<T2, T1 being the melting temperature of the core material, and T2 being the melting temperature of the jacket material. In embodiments, T1 may be at least 300° C. less than T2, wherein T2−X=T1, wherein x is in the range of 300° C. to 2800° C.

For example, the core material is a metal and includes copper, aluminum, gold, silver or alloys including one or more of these elements. The jacket material is also a metal and includes, for example, tungsten, cobalt, ruthenium, molybdenum or alloys including one or more of these elements. In particular embodiments, the core material includes copper or alloys thereof and the jacket material excludes copper, i.e., non-copper containing.

Figure 2:
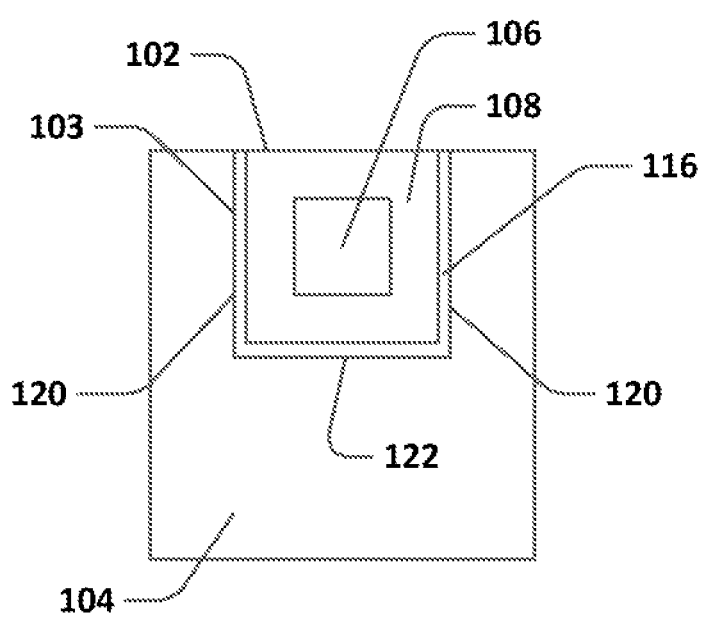
FIG. 2 illustrates a cross-section of an embodiment of a wire formed in an opening in an interlayer dielectric, having a diffusion barrier applied in the opening between the interlayer dielectric and the wire.

As illustrated in the embodiment of FIG. 2, an optional diffusion barrier 116 is provided between the wire 102 and the metallization layer 104. Thus, the diffusion barrier is deposited on the walls 120 and bottom 122 of opening 103 in the metallization layer 104. The diffusion barrier 116 may be understood as a layer of material that reduces or prevents diffusion of the wire material into the interlayer dielectric. The diffusion barrier has a thickness in the range of 5 nm to 10 nm, including all values and ranges therein. Examples of diffusion barrier materials include one or more of the following: tantalum, tantalum nitride, cobalt alloys, and tungsten nitride. In embodiments, the materials exhibit a higher resistivity than the jacket materials, such as from 10 µΩ·cm or greater, such as in the range of 10 µΩ·cm to 300 µΩ·cm. As noted above, the jackets 108 surround the entire periphery of the wire 102 cross-section, whereas the diffusion barrier 116 is provided on the sides of the wire that contact the dielectric, including the side walls 120 and the bottom 122 of the opening 103. Furthermore, the diffusion barrier 116 occupies 10% or less of the cross-sectional area of the opening 103, including all values and ranges therein, such as 1% to 5%, etc.

Figure 3:
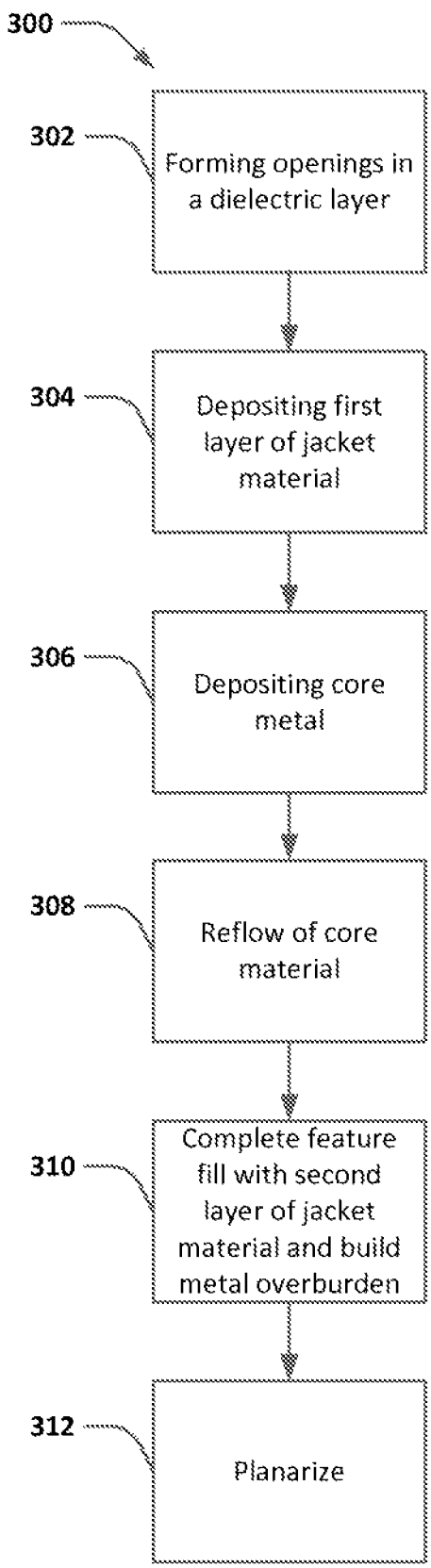
FIG. 3 illustrates an embodiment of a method of depositing wires in a substrate including a core and a jacket.

FIG. 3 illustrates an embodiment of a method of providing the wires described herein and FIGS. 4a through 4e illustrate the wire growth as the method illustrated in FIG. 3 progresses. Referring to FIG. 3, the method 300 includes patterning a metallization layer, such as an interlayer dielectric, and forming the openings in the metallization layer 302.

In an embodiment, patterning includes depositing a photoresist over the metallization layer. The photoresist is a positive or negative resist and may include for example, poly(methyl methacrylate), poly(methyl glutarimide), DNQ/novolac, or SU-8 (an epoxy based negative resist). The photoresist is deposited by a casting process such as, for example, spin-coating. Spin coating, may be performed at 1 to 10,000 rpm, including all values and ranges therein, for a time period in the range of 1 second to 10 seconds, including all values and ranges therein.

The photoresist is then patterned by optically projecting an image of a desired pattern onto the photoresist using photolithography, such as optical photolithography, immersion photolithography, deep UV lithography, extreme UV lithography, or other techniques, wherein the wavelength of projected light may be up to 436 nm, including all values and ranges from 157 nm to 436 nm, such as 157 nm, 193 nm, 248 nm, etc. A developer, such as tetramethylammonium hydroxide TMAH (with or without surfactant) at a concentration of in the range of 0.1 N to 0.3 N, is applied to the photoresist, such as by spin-coating, and portions of the photoresist are removed to expose regions of the underlying dielectric layer correlating to the desired pattern.

In embodiments, baking of the dielectric may occur before or after any of the above steps. For example, the metallization layer may be prebaked to remove surface water at a temperature in the range of 200° C. to 400° C., including all values and ranges therein, for a time of 30 to 60 minutes, including all values and ranges therein. After application of the photoresist, a post application bake may occur, wherein at least a portion of the solvents in the photoresist are driven off. A post application bake is, for example, performed at temperatures in the range of 70° C. to 140° C., including all values and ranges therein, for a time period in the range of 60 seconds to 240 seconds, including all values and ranges therein. After patterning, the resist may be hard baked at a temperature in the range of 100° C. to 300° C., including all values and ranges therein, for a time period of 1 minute to 10 minutes, including all values and ranges therein.

Figure 4A:
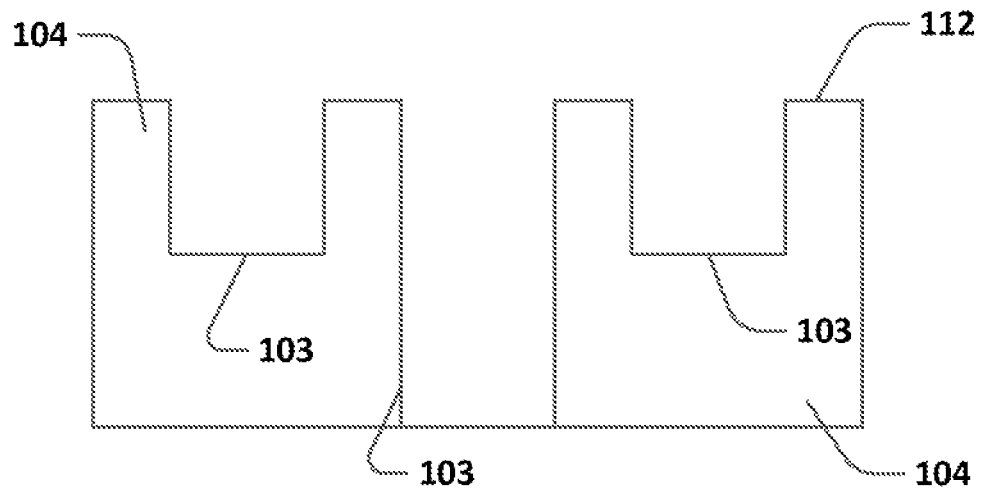
FIG. 4a illustrates a cross-section of an embodiment of an interlayer dielectric prior to the deposition of a wire in openings formed in the interlayer dielectric.

The exposed portions of the metallization layer are chemically etched, wherein the exposed portions of the surface are removed until a desired depth is achieved, forming openings in the metallization layer. The remaining photoresist is optionally removed via a process such as ashing, wherein the photoresist is exposed to oxygen or fluorine, which combines with the photoresist to form ash. FIG. 4a illustrates an embodiment of a patterned metallization layer 104 including one or more openings 103 formed in a surface 112.

Referring again to FIG. 3, after patterning the metallization layer, a first layer of the metal forming a portion of the jacket that contacts the bottom and lower portions of the side walls is deposited into the openings 304. In embodiments, the first layer of jacket material is deposited by a conformal coating process, wherein the first metal is deposited on any exposed surface of the metallization layer, including on the sidewalls and bottom of any opening formed in the metallization layer. A conformal coating may, therefore, be understood as a coating that is applied to exposed surfaces of the metallization layer, and not, for example, just the horizontal surfaces. In embodiments, the coating exhibits a variation in thickness of less than 35%, including all values and ranges from 1% to 35%, such as 10% or less, 15% or less, 20% of less, 25% or less, etc. The conformal coating process is selected from a process such as chemical vapor deposition or atomic layer deposition. In chemical vapor deposition, for example, one or more reactive gases are provided in a chamber including the dielectric at a flow rate of 1 to 50 sccm, including all values and ranges therein. The reactive gas may be selected from one or more of the following: tungsten hexafluoride with or without hydrogen, molybdenum pentachloride with hydrogen, molybdenum hexacarbonyl, tungsten hexacarbonyl, bis(ethylcyclopentadienyl)ruthenium(II), bis(cyclopentadienyl)ruthenium(II), bis(pentamethylcyclopentadienyl)ruthenium (II), triruthenium dodecycarbonyl, dicobalt octacarbonyl, bis(cyclopentadienyl)cobalt(II), bis(ethylcyclopentadienyl)cobalt(II), bis(pentamethylcyclopentadienyl)cobalt(II), etc. The reactive gas may be provided with a carrier gas, such as an inert gas, which may include, for example, argon.

Figure 4B:
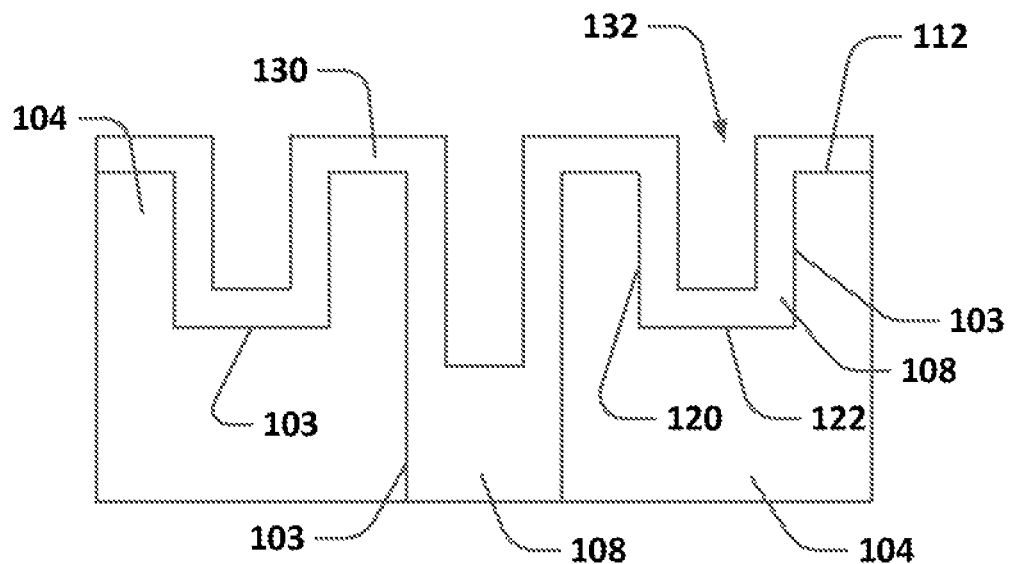
FIG. 4b illustrates a cross-section of an embodiment of an interlayer dielectric including a conformal coating of a first layer of the jacket material.

The chamber is maintained at atmospheric pressure, low pressure (sub-atmospheric, i.e., $1 \times 10^{-1}$ torr to $1 \times 10^{-6}$ torr) or ultrahigh vacuum (i.e., $1 \times 10^{-7}$ torr to $1 \times 10^{-8}$ torr). In embodiments, the chamber is maintained at a pressure in the range of $10^{-1}$ to $10^{-3}$ torr, including all values and ranges therein, and a temperature in the range of 20° C. to 500° C., including all values and ranges therein. The process may, in embodiments, be plasma assisted wherein electrodes are provided within the process chamber and are used to ionize the gases, or a plasma is formed outside of the chamber and the plasma is then provided to the chamber. In the chamber, a layer of the metal is deposited on the surface of the dielectric due to reaction of the gas. FIG. 4b illustrates an embodiment of a metallization layer 104 including a conformal coating 130 of the first layer of the metal forming a portion of the jacket 108 over the surfaces 112 of the interlayer dielectric of the metallization layer, including along the walls 120 and bottom 122 of the openings 103. This in turn forms second openings or features 132, which receive the core material in further steps.

Referring again to FIG. 3, after depositing the first layer of jacket material, forming a portion of the jacket, the core material then is deposited 306 by vapor deposition processes, including physical vapor deposition or chemical vapor deposition. Physical vapor deposition includes, for example, magnetron sputtering, evaporative deposition or e-beam deposition. Chemical vapor deposition may be performed by the processes outlined above.

An example of physical vapor deposition includes supplying an inert gas, such as argon, at a flow rate in the range of 5 sccm to 100 sccm, including all values and ranges therein, into a process chamber, which is held at a pressure in the range of $1 \times 10^{-1}$ to $10^{-7}$ torr, including all values and ranges therein. The process chamber includes a workpiece, i.e., the dielectric, and a metal source, called a target, formed of copper or aluminum. The metal source is biased by a DC source rated in the range of 0.1 to 50 kW, including all values and ranges therein. The workpiece, or worktable upon which the workpiece is positioned, may also be biased to by an AC source rated in the range of 0.1 to 1.5 kW, including all values and ranges therein. A plasma forms and is localized around the target due to magnets positioned proximal to or behind the target. The plasma bombards the target sputtering away the metal atoms as a vapor, which is then deposited on the workpiece. The process continues for a time period in the range of 1 second to 100 seconds, including all values and ranges therein, such as 5 seconds, 10 seconds, 30 seconds, etc. to allow growth of a layer of core material on the dielectric layer surface.

Figure 4C:
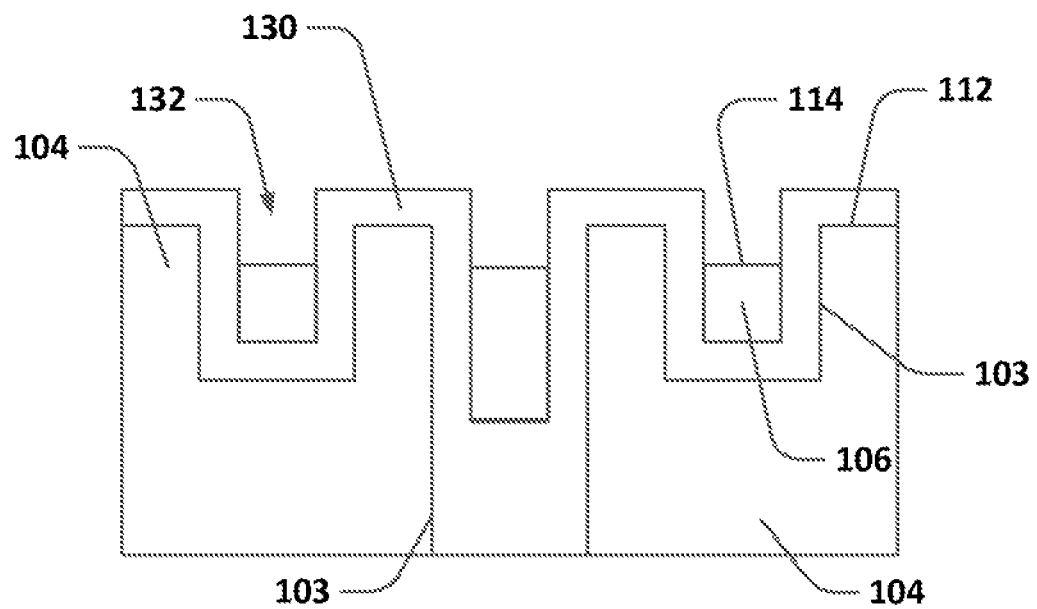
FIG. 4c illustrates a cross-section of an embodiment of an interlayer dielectric after the deposition and reflow of the material forming the wire cores.

Sufficient core material is applied to only partially fill the second openings or features 132 formed by the first metal layer deposited in the openings, wherein 25% to 75% of the total volume of the each opening 103 is filled with the core material, the remainder being filled with the jacket material by the end of the process. Once the core material is deposited on that first metal layer, the core material is then reflowed 308 to cause the core material to flow into the openings of the metallization layer and form a reflowed core material. To reflow the core material, the core material is subject or exposed to elevated temperatures in the range of 200° C. to 1100° C., including all values and ranges therein, such as from 200° C. to 800° C., 300° C., 500° C., 800° C., applied by radiative, furnace, lamp, microwave, or hot gas. The core material may be reflowed for a time period in the range of 1 minute to 100 minutes, including all values and ranges therein, such as 30 minutes, 45 minutes, etc. FIG. 4c illustrates an embodiment of the core material after reflow occurs. As illustrated, the core 106 partially fills the second openings 132 formed in the first metal layer 130, such that the upper surface 114 of the core 106 material is below the surface 112 of the metallization layer 104.

Figure 4D:
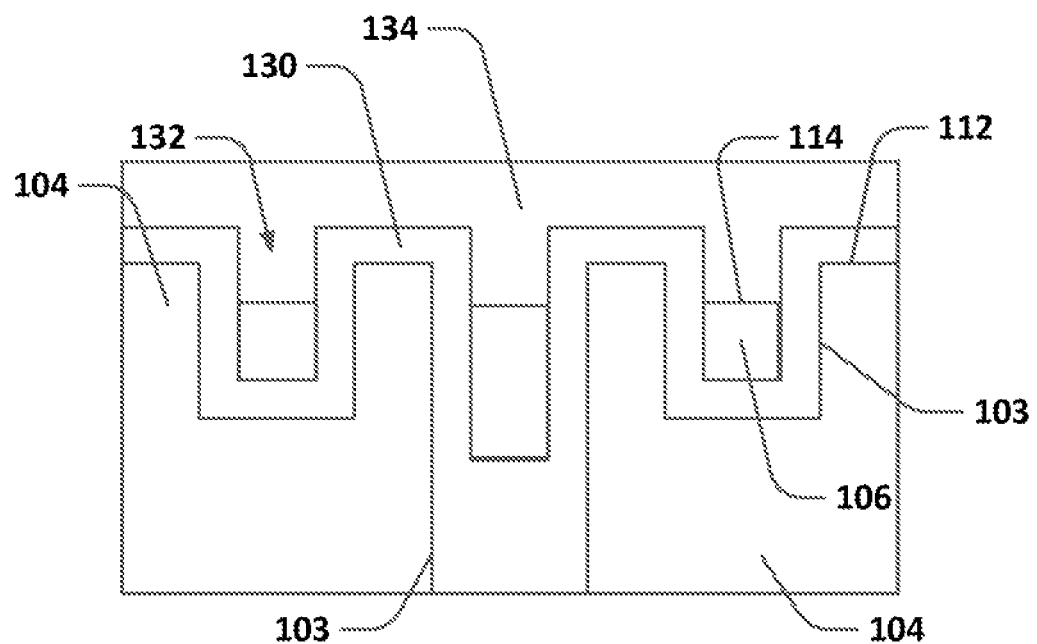
FIG. 4d illustrates a cross-section of an embodiment of an interlayer dielectric after the deposition of the remainder of the jacket material.

Referring again to FIG. 3, after the core material is deposited onto the metallization layer, at 308 additional jacket metal, i.e., a second layer, is deposited into the unfilled portion of the features 132 as seen in FIG. 4d. An overburden 134 is developed over the surface 112 of the metallization layer 104 and the openings 103 to ensure filing of the features 132. The overburden may be understood as an excess of material on the dielectric surface of the metallization layer and will later be removed.

In embodiments, the second layer of the jacket metal is deposited using vapor deposition. For example chemical vapor deposition is employed, using the process described above with respect to forming a conformal coating of the first layer of jacket metal in the openings, or physical vapor deposition may be employed, such as by the process described above to apply the core material to the metallization layer, substituting the target with the jacket materials described above. In particular embodiments, prior to the filling of the remainder of the jacket material, the core wire is optionally dry or wet cleaned to remove oxidation from the core material surface. This may be performed by sputtering the core material surface with an ionized gas or by chemical etching to remove the any oxidized material.

Figure 4E:
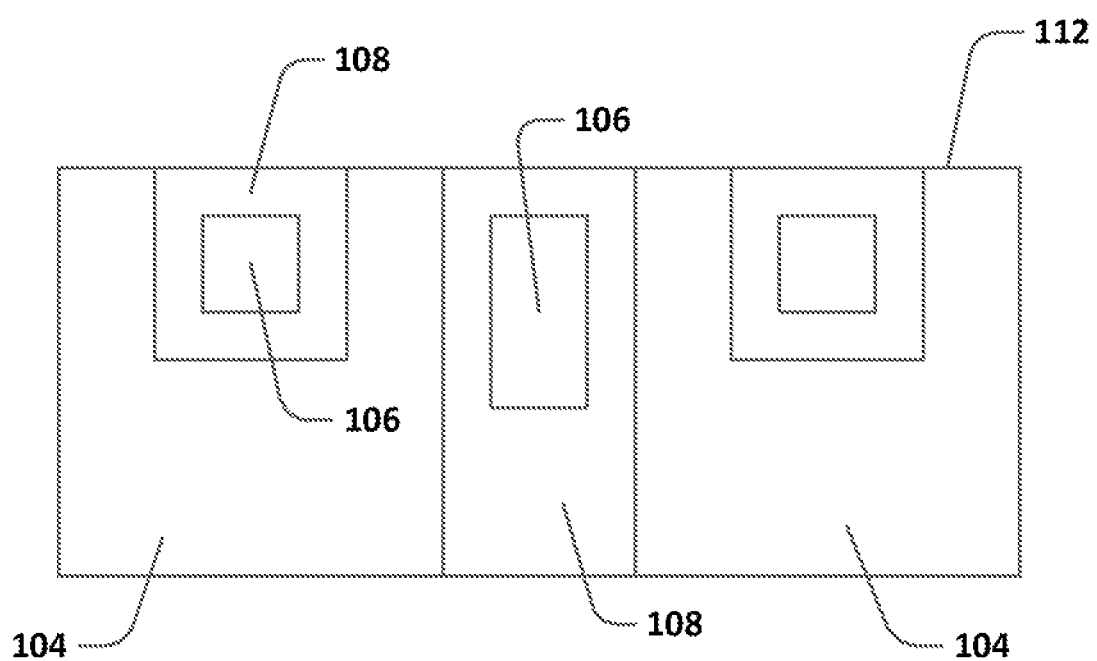
FIG. 4e illustrates a cross-section of an embodiment of an interlayer dielectric after planarization of the jacket material, exposing the surface of the interlayer dielectric.

The metallization layer is then planarized 310 to remove the overburden. In embodiments, planarization is performed using chemical mechanical planarization, which may be understood as a process that utilizes a polishing surface, an abrasive and a slurry to remove the overburden and planarize the surface of the metallization layer and wires. Material is removed from the metallization layer until the dielectric surface is exposed. FIG. 4e illustrates a metallization layer 104 after planarization, wherein overburden is removed exposing the interlayer dielectric surface 112 and a portion of the jacket 108.

As alluded to above, the metallization layers may be deposited directly or indirectly on a substrate, such as a silicon wafer, forming an integrated circuit. The integrated circuit is an analog or digital circuit. The integrated circuit may be used in a number of applications, such as microprocessors, opto-electronics, logic blocks, audio amplifiers, etc. The integrated circuit may be employed as part chipset for executing one or more related functions in a computer.

EXAMPLES

Example 1

As noted above, factors that may affect the amount of current that may be carried on a wire include maximum voltage drop across a wire and electromigration.

Figure 5:
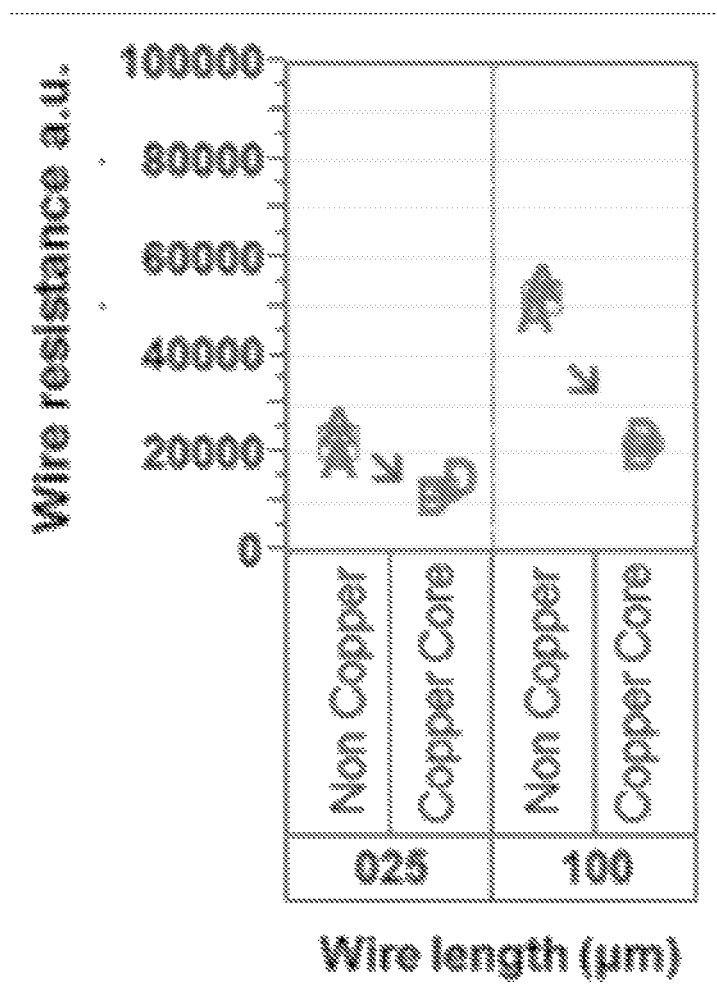
FIG. 5 illustrates an example of wire resistance versus wire length for a copper core and cobalt having the same diameter.

Maximum voltage drop across a wire is in part, dictated by the wire resistance, which is influenced by the resistivity of the wire material. FIG. 5 illustrates an example of the resistance of cobalt and copper core wires of 25 µm and 100 µm in length and a cross sectional area of 250 nm2 The graph illustrates that copper core has lower resistance per unit length, which allows application to longer wire lengths.

Example 2

Figure 6:
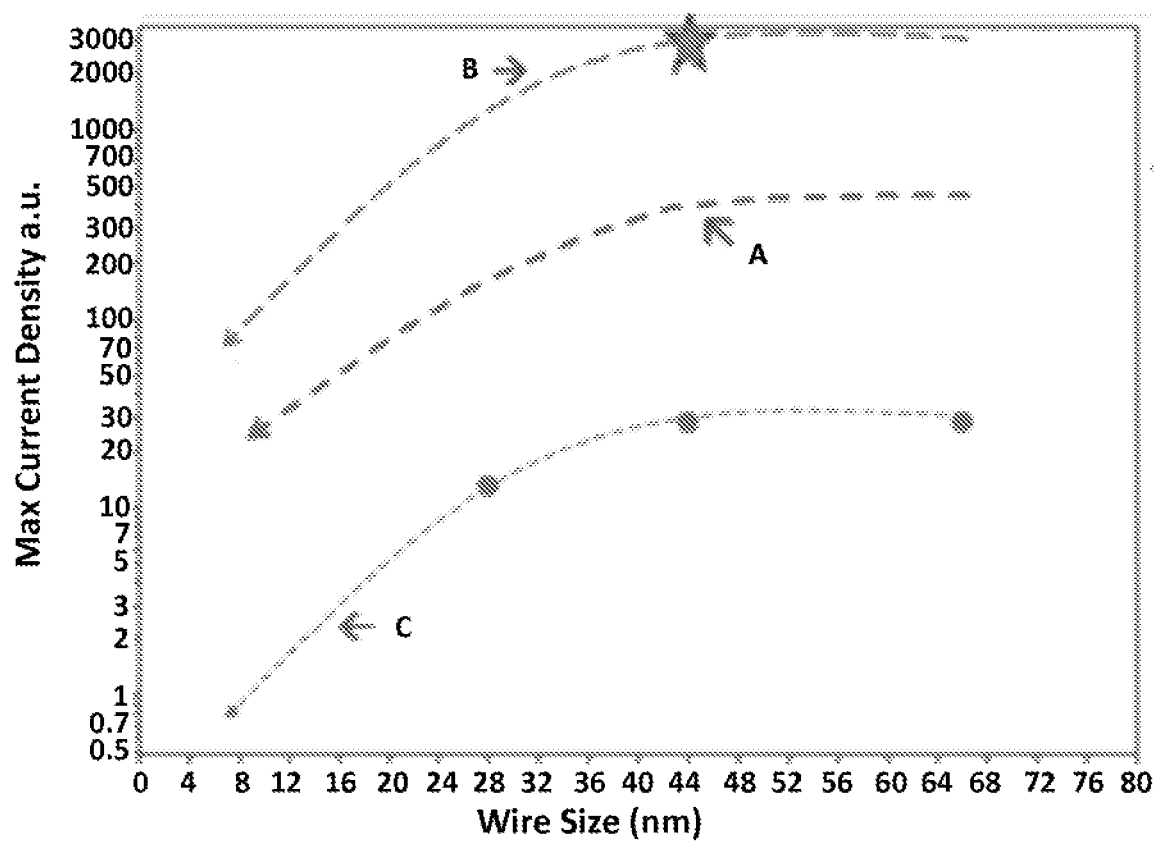
FIG. 6 illustrates an example of maximum current density of wires having various diameters formed from A) a cobalt jacket and copper core; B) cobalt; and C) copper.

To demonstrate the effect of material on maximum current density, FIG. 6 illustrates an example of the estimated maximum current density for a copper core surrounded by a cobalt jacket (A) of various wire sizes (diameters) compared to the maximum current density of cobalt (B) and the maximum current density of copper (C) of like wire sizes. Exceeding the maximum current density may lead to electromigration. As illustrated, by jacketing a copper core in cobalt, the estimated maximum current density is increased as compared to the use of copper wire alone.

Example 3

A sample was prepared according to the method herein, wherein a metallization layer including an interlayer dielectric of carbon doped oxide deposited on silicon was patterned using 193 nm photolithography forming a number of openings in the interlayer dielectric. A chemical assisted photoresist was deposited via spin coating at 500 rpm for 60 seconds. After prebaking at a temperature of 150° C. for a period of 2 min, the photoresist was patterned using 193 nm light. Then the substrate was baked again at a temperature of 250° C. and a time period of 5 min.

An alkaline developer was applied via spin coating and selected portions of the photoresist was removed. The photoresist was then hardbaked at a temperature of 250° C. for a time period of 5 min. The exposed regions of the interlayer dielectric were etched using fluorocarbon plasma for a period of time of 2 min, a temperature of 100° C. and a pressure of between a few millitorr and a few hundred millitorr. After etching, the remaining photoresist is removed by exposure to an oxygen plasma, which combines with the photoresist to form ash.

After etching, cobalt (metal 1) was deposited onto the interlayer dielectric by chemical vapor deposition using a cobalt precursor bis(cyclopentadienyl)cobalt(II). The process was performed at a pressure of 10 Torr and a temperature of 200° C. Precursor was introduced at a flow rate of 25 sccm. The system was maintained at a pressure of 10-100 Torr during deposition. The cobalt formed a conformal coating along the bottom and side walls of the metallization layer openings as well as across the upper surface or mesas of the metallization layer, forming recesses.

Copper was then deposited on the cobalt by physical vapor deposition, and specifically magnetron sputtering. The copper was then caused to reflow into the recesses by heating the deposited copper at temperatures of 300 to 400° C. for a time period of 50 second to 500 seconds. The reflowed copper partially filled the recess such that a height difference was present between the upper surface of the copper and upper surface of the metallization layer. The recesses were then completely filled and a metal overburden was formed using cobalt via the chemical vapor deposition process used to form the conformal coating. Chemical mechanical planarization was then used to remove overburden and level the wires with the upper surface of the substrate. When necessary, between steps, the substrate was cleaned to reduce or remove oxides and other reaction products formed on the surface.

Figure 7:
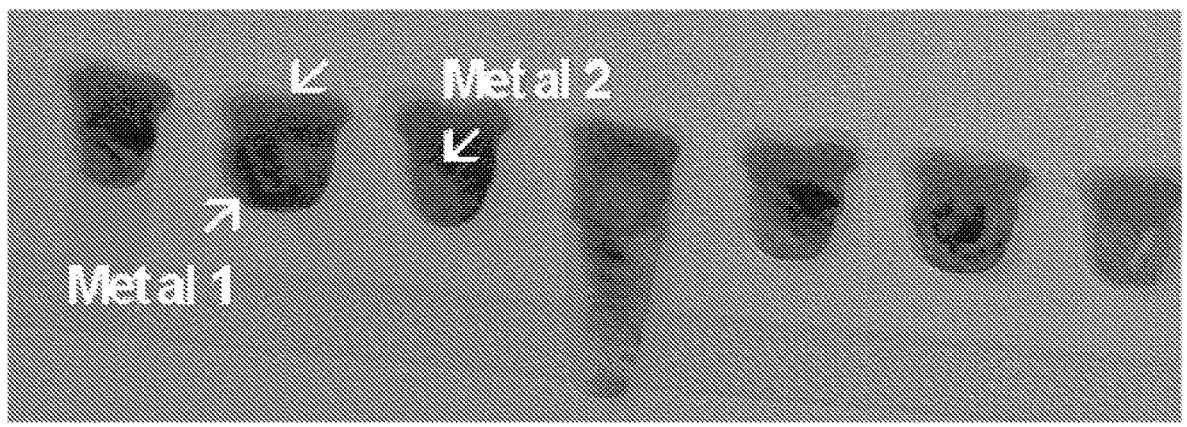
FIG. 7 illustrates a transmission electron microscope image of a cross-section of an embodiment of wires formed in an interlayer dielectric including a core and jacket.
Figure 8:
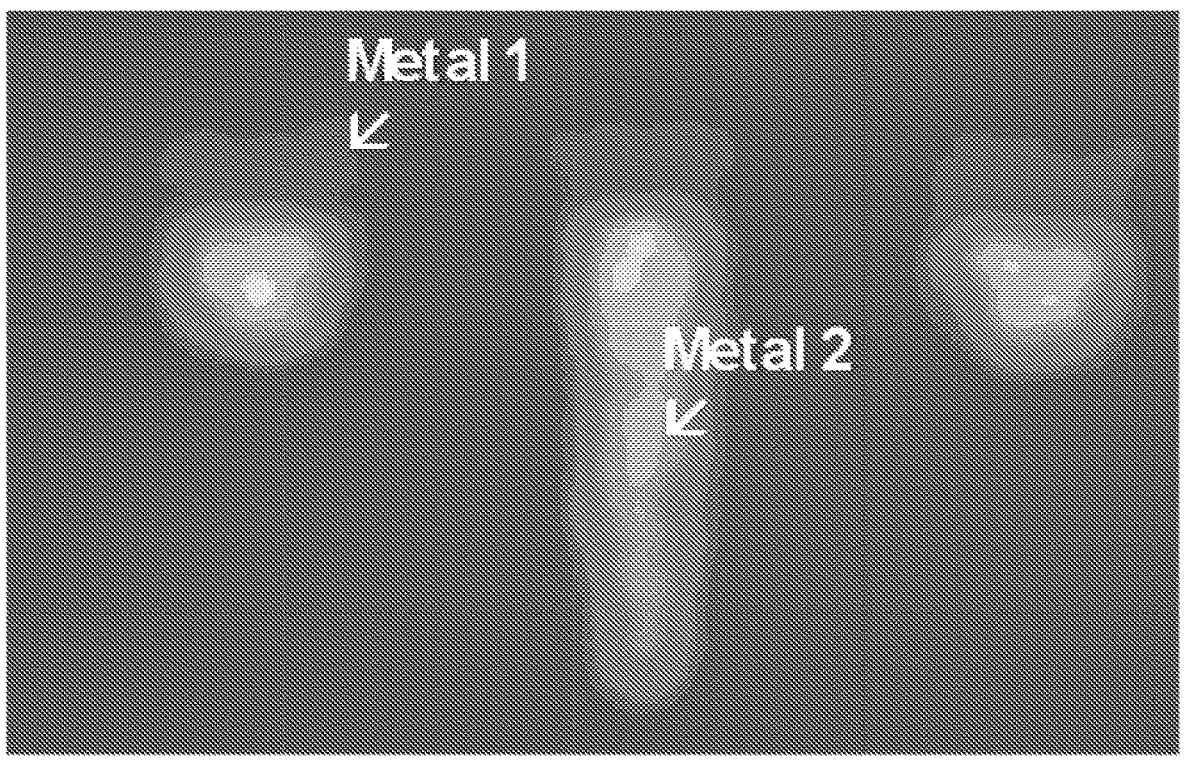
FIG. 8 illustrates an electron dispersive spectrograph image of a cross-section of an embodiment of wires formed in an interlayer dielectric including a core and a jacket.

Transmission electron microscopy (TEM) and electron dispersive spectrography (EDS) were performed on the sample at a magnification of 450 kX, at an acceleration voltage of 200 kV and a working distance of −1.0 mm FIG. 7 illustrates a TEM image captured of the sample (the scale at the lower left hand corner is 10 nm) and FIG. 8 illustrates an EDS image captured of the sample (the scale at the lower right hand corner is 20 nm). As seen in the images, the cobalt (Metal 1) completely surrounds the copper (Metal 2) within the openings formed in the metallization layer.

As seen in the examples above, the arrangements and methods herein provide a reduced resistance in wires compared to the use of refractory metals alone in wires of the same geometry. As the length of a wire of a given diameter increases, the reduction in resistance is improved. In addition, the arrangement provides relatively improved maximum current density and electromigration performance as compared to instances where the core material is used alone. Maximum current density may be understood as the maximum allowable current that may pass through a conductor without the occurrence of electromigration. In embodiments, the improvement is expected to reach an order of magnitude or more.

An aspect of the present disclosure relates to a method of forming a wire in a dielectric layer. The method includes forming a first opening in a dielectric layer. In embodiments, the dielectric layer exhibits a dielectric constant of lower than 3.9 and, preferably, a dielectric constant in the range of 1.5 to 3.8. For example, the dielectric layer includes one or more materials selected from the group consisting of fluorine-doped silicon dioxide, carbon-doped silicon dioxide, organo silicate glass, silicon oxycarbide, hydrogenated silicon oxycarbide, porous silicon dioxide, and organic polymer dielectrics such as polyimide, polytetrafluoroethylene, polynorbornenes, benzocyclobutene, hydrogen silsesquioxane and methylsilsesquioxane. In any of the above embodiments, the openings are formed in the dielectric layer by photolithography.

The method also includes depositing a conformal coating of a first layer of a jacket material on the dielectric layer and forming a second opening in the first opening. In any of the above embodiments, the conformal coating is formed by chemical vapor deposition. Alternatively, or additionally, the conformal coating is formed using atomic layer deposition.

The method further includes depositing a core material on the conformal coating and reflowing the core material wherein the core material partially fills the second opening. In any of the above embodiments, the core material is deposited using physical vapor deposition or chemical vapor deposition.

In addition, the method includes depositing a second layer of the jacket material over the core material and the first layer of the jacket material, filling the second opening and forming a wire, wherein the core material is surrounded by the jacket material. In any of the above embodiments, the second layer of the jacket material is deposited using chemical vapor deposition or physical vapor deposition.

The jacket material exhibits a first resistivity $\rho 1$ and the core material exhibits a second resistivity $\rho 2$ and $\rho 2$ is less than $\rho 1$. In any of the above embodiments, jacket material exhibits a resistivity of 5.0 $\mu\Omega\cdot$cm or greater. In any of the above embodiments, the core material exhibits a resistivity of 4.0 $\mu\Omega\cdot$cm or less. For example, the core material comprises copper and the jacket material excludes copper. In any of the above embodiments, the core material exhibits a first melting temperature and the jacket material exhibits a second melting temperature, wherein the first melting temperature is less than the second melting temperature. In examples, the core material includes one or more metals selected from the group consisting of copper, aluminum, gold and silver. In examples the jacket material includes one or more metals selected from the group consisting of tungsten, cobalt, ruthenium and molybdenum.

In any of the above embodiments, the first opening defines a volume and the jacket material is present in the range of 25% to 75% of the volume.

In any of the above embodiments, the method also includes forming an overburden of the second layer of the jacket material over a surface of the dielectric layer. The method further comprises planarizing the second layer of jacket material until the surface of the dielectric layer is exposed.

In another aspect of the present disclosure a metallization layer is provided. An opening is defined in a dielectric layer and a wire is positioned within the opening. The wire includes a core material surrounded by a jacket material, wherein the jacket material exhibits a first resistivity $\rho 1$ and the core material exhibits a second resistivity $\rho 2$ and $\rho 2$ is less than $\rho 1$. In addition, in embodiments, the jacket material is present in the range of 25% to 75% of the volume of the opening.

In embodiments, the metallization layer exhibits a dielectric constant of lower than 3.9 and preferably, a dielectric constant in the range of 1.5 to 3.8. The metallization layer includes, for example, one or more materials selected from the group consisting of fluorine-doped silicon dioxide, carbon-doped silicon dioxide, organo silicate glass, silicon oxycarbide, hydrogenated silicon oxycarbide, porous silicon dioxide, and organic polymer dielectrics such as polyimide, polytetrafluoroethylene, polynorbornenes, benzocyclobutene, hydrogen silsesquioxane and methylsilsesquioxane.

In any of the above embodiments, the jacket material exhibits a resistivity of 5.0 $\mu\Omega\cdot$cm or greater, preferably in the range of 5.0 $\mu\Omega\cdot$cm to 8.0 $\mu\Omega\cdot$cm, and the core material exhibits a resistivity of 4.0 $\mu\Omega\cdot$cm or less, preferably in the range of 1.0 $\mu\Omega\cdot$cm to 4.0 $\mu\Omega\cdot$cm. In any of the above embodiments, the core material exhibits a first melting temperature and the jacket material exhibits a second melting temperature, wherein the first melting temperature is less than the second melting temperature. For example, the core material includes one or more metals selected from the group consisting of copper, aluminum, gold and silver. For example, jacket material includes one or more metals selected from the group consisting of tungsten, cobalt, ruthenium and molybdenum. In particular embodiments, the core material includes copper and the jacket material excludes copper.

In embodiments, the metallization layer is prepared according to any of the embodiments of the method described above.

In yet another aspect, the present disclosure relates to an integrated circuit including one or more dielectric layers, a plurality of openings defined in each of the dielectric layers, and a plurality of wires connected to one or more components associated with the integrated circuit. Each wire is positioned within one of the openings and the wires include a core material surrounded by a jacket material, wherein the jacket material exhibits a first resistivity ρ1 and the core material exhibits a second resistivity ρ2 and ρ2 is less than ρ1. Further, the jacket material is present in the range of 25% to 75% of the volume of the opening.

In embodiments, the dielectric layer(s) of the integrated circuit exhibits a dielectric constant of lower than 3.9 and preferably, a dielectric constant in the range of 1.5 to 3.8. The dielectric layer(s) includes, for example, one or more materials selected from the group consisting of fluorine-doped silicon dioxide, carbon-doped silicon dioxide, organo silicate glass, silicon oxycarbide, hydrogenated silicon oxycarbide, porous silicon dioxide, and organic polymer dielectrics such as polyimide, polytetrafluoroethylene, polynorbornenes, benzocyclobutene, hydrogen silsesquioxane and methylsilsesquioxane.

In any of the above embodiments, the jacket material exhibits a resistivity of 5.0 µΩ·cm or greater, preferably in the range of 5.0 µΩ·cm to 8.0 µΩ·cm, and the core material exhibits a resistivity of 4.0 µΩ·cm or less, preferably in the range of 1.0 µΩ·cm to 4.0 µΩ·cm. In any of the above embodiments, the core material exhibits a first melting temperature and the jacket material exhibits a second melting temperature, wherein the first melting temperature is less than the second melting temperature. For example, the core material includes one or more metals selected from the group consisting of copper, aluminum, gold and silver. For example, jacket material includes one or more metals selected from the group consisting of tungsten, cobalt, ruthenium and molybdenum. In particular embodiments, the core material includes copper and the jacket material excludes copper.

In embodiments, the integrated circuit is prepared according to any one of the methods described above and includes metallization layers according to any one of the embodiments described above.

The foregoing description of several methods and embodiments has been presented for purposes of illustration. It is not intended to be exhaustive or to limit the claims to the precise steps and/or forms disclosed, and obviously many modifications and variations are possible in light of the above teaching. It is intended that the scope of the invention be defined by the claims appended hereto.

What is claimed is:

1. An integrated circuit structure, comprising:
    a dielectric material;
    a first trench in the dielectric material, the first trench having a bottom and sidewalls;
    a second trench in the dielectric material, the second trench having a bottom and sidewalls, and the second trench laterally spaced apart from the first trench;
    a first core material within the first trench, the first core material having a bottom surface, sidewall surfaces and a top surface;
    a second core material within the second trench, the second core material having a bottom surface, sidewall surfaces and a top surface, the second core material having a vertical thickness different than a vertical thickness of the first core material;
    a first jacket on the bottom surface, along the sidewall surfaces and on the top surface of the first core material in a cross-section perspective, wherein at least a portion of the first jacket on the top surface of the first core material is within the first trench in the dielectric material; and
    a second jacket on the bottom surface, along the sidewall surfaces and on the top surface of the second core material in the cross-section perspective, wherein at least a portion of the second jacket on the top surface of the second core material is within the second trench in the dielectric material.

2. The integrated circuit structure of claim 1, wherein the dielectric material comprises silicon, oxygen and carbon.

3. The integrated circuit structure of claim 1, wherein the first core material and the second core material comprise copper.

4. The integrated circuit structure of claim 1, wherein the first jacket and the second jacket comprise cobalt.

5. The integrated circuit structure of claim 1, further comprising:
    a first barrier layer between the bottom of the first trench and the first jacket, the first barrier layer between the sidewalls of the first trench and the first jacket; and
    a second barrier layer between the bottom of the second trench and the second jacket, the second barrier layer between the sidewalls of the second trench and the second jacket.

6. The integrated circuit structure of claim 5, wherein the first barrier layer and the second barrier layer comprise tantalum.

7. The integrated circuit structure of claim 6, wherein the first barrier layer and the second barrier layer comprise nitrogen.

8. The integrated circuit structure of claim 1, wherein the first core material and the second core material further comprise a second metal, the second metal different than copper.

9. The integrated circuit structure of claim 8, wherein the first core material and the second core material comprise an alloy of copper and the second metal.

10. A method of fabricating an integrated circuit structure, the method comprising:
    forming a dielectric material;
    forming a first trench in the dielectric material, the first trench having a bottom and sidewalls;
    forming a second trench in the dielectric material, the second trench having a bottom and sidewalls, and the second trench laterally spaced apart from the first trench;
    forming a first core material within the first trench, the first core material having a bottom surface, sidewall surfaces and a top surface;
    forming a second core material within the second trench, the second core material having a bottom surface, sidewall surfaces and a top surface, the second core material having a vertical thickness different than a vertical thickness of the first core material;

forming a first jacket on the bottom surface, along the sidewall surfaces and on the top surface of the first core material in a cross-section perspective, wherein at least a portion of the first jacket on the top surface of the first core material is within the first trench in the dielectric material; and forming a second jacket on the bottom surface, along the sidewall surfaces and on the top surface of the second core material in the cross-section perspective, wherein at least a portion of the second jacket on the top surface of the second core material is within the second trench in the dielectric material.

11. The method of claim 10, wherein the dielectric material comprises silicon, oxygen and carbon.

12. The method of claim 10, wherein the first core material and the second core material comprise copper.

13. The method of claim 10, wherein the first jacket and the second jacket comprise cobalt.

14. The method of claim 10, further comprising:
forming a first barrier layer between the bottom of the first trench and the first jacket, the first barrier layer between the sidewalls of the first trench and the first jacket; and
forming a second barrier layer between the bottom of the second trench and the second jacket, the second barrier layer between the sidewalls of the second trench and the second jacket.

15. The method of claim 14, wherein the first barrier layer and the second barrier layer comprise tantalum.

16. The method of claim 15, wherein the first barrier layer and the second barrier layer comprise nitrogen.

17. The method of claim 10, wherein the first core material and the second core material further comprise a second metal, the second metal different than copper.

18. The method of claim 17, wherein the first core material and the second core material comprise an alloy of copper and the second metal.

* * * * *